United States Patent
White

(10) Patent No.: US 6,208,212 B1
(45) Date of Patent: Mar. 27, 2001

(54) DELAY CELL WITH CONTROLLED OUTPUT AMPLITUDE

(75) Inventor: Steven L. White, Raleigh, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/266,317

(22) Filed: Mar. 11, 1999

(51) Int. Cl.[7] ................................... H03B 27/00
(52) U.S. Cl. .................. 331/57; 327/215; 327/266
(58) Field of Search ................ 331/55, 57, 116 R, 331/116 FE, 143; 327/274, 280, 266, 287, 182, 215, 270, 261

(56) References Cited

U.S. PATENT DOCUMENTS

| | | |
|---|---|---|
| 4,833,695 | 5/1989 | Greub . |
| 4,866,314 * | 9/1989 | Traa ..................................... 327/278 |
| 5,066,877 * | 11/1991 | Hamano et al. ...................... 327/280 |
| 5,559,476 * | 9/1996 | Zhang et al. ........................... 331/57 |

* cited by examiner

Primary Examiner—Robert Pascal
Assistant Examiner—Kimberly E Glenn
(74) Attorney, Agent, or Firm—Wood, Phillips, VanSanten, Clark & Mortimer

(57) ABSTRACT

A delay cell comprises a fast delay stage including a differential amplifier for connection to a differential input. A slow delay stage includes a differential amplifier connected in parallel with the fast delay stage differential amplifier and having capacitance means for setting a delay amount. A current source develops a bias current. A current switch is connected between the current source and the fast delay stage and the slow delay stage to switch the bias current between the fast delay stage and the slow delay stage. An output circuit is connected to the fast and slow delay stages for developing a differential output delayed relative to the differential input responsive to a ratio between fast delay stage current and slow delay stage current.

31 Claims, 3 Drawing Sheets

DELAY CELL WITH CONTROLLED OUTPUT AMPLITUDE

FIELD OF THE INVENTION

This invention relates to a delay cell used, for example, in a ring oscillator and, more particularly, a delay cell with controlled output amplitude.

BACKGROUND OF THE INVENTION

A ring oscillator can be formed by connecting an odd number of inversions in a ring. This creates an unstable state to produce an oscillation. The oscillation frequency depends on the delay around the ring. The output can be taken at any point in the ring. A ring oscillator made of differential 2N stages, where N is greater than zero, of which only an odd number can invert, has quadrature outputs available. If only single-ended outputs are available, then 4N stages are required. Such ring oscillators are used to generate clocks for digital systems and signals for communication systems. The building block for the ring oscillator is a delay element also known as a delay cell.

In bipolar technology differential amplifiers have been used as the time delay element in the ring oscillator. The differential amplifiers are connected either inverting or non-inverting. The differential amplifier comprises an emitter coupled transistor pair, with the emitters connected to a current source. The bases are connected to a differential input. The collectors are connected via load resistors to a positive voltage source. The differential output is taken across the collectors via buffer transistors. The current source is varied to control the delay. As the current is increased, the speed of the stage increases, resulting in time delay decrease and a ring oscillator frequency increase. However, the output swing is defined by source current multiplied by load resistance. Because load resistance is not variable, the output level decreases with decreases in source current. This reduces the usable frequency range because the output becomes too low to drive the next stage in the ring. The low frequency usable range is also hindered because too high of a signal swing on the internal nodes comprising the collectors of the emitter-coupled pair on the load resistors can cause the transistors of the emitter-coupled pair to leave their intended linear operating region. This makes the stage both slower and its output unsymmetrical, and requires a more complex biasing scheme to control, or even a higher supply voltage.

Another prior design removes output level variance on frequency. A bias current is switched between two paths. The first path is a high speed path and the second path is a lower speed path comprised of two stages. The final output frequency is determined by a current switch which sets the portion of bias current flowing through the high speed paths single stage and the second stage of the slower path. Because the high speed stage and the second stage of the slower path share the load, the output is always determined by the total bias current multiplied by the load resistance. Because both are constant, the output is constant versus frequency. However, this circuit requires an additional bias current through the first stage of the slow path. Also, such delay cell is limited by a two-stage slow path. The minimum difference between the fast and slow path is limited by the maximum speed of the first stage of the slow path.

The present invention is directed to overcoming the problems discussed above in a novel and simple manner.

SUMMARY OF THE INVENTION

Broadly, there is disclosed herein a delay circuit with controlled output amplitude.

The delay circuit comprises a fast delay stage comprising a differential amplifier for connection to a differential input. A slow delay stage comprises a differential amplifier connected in parallel with the fast delay stage differential amplifier and having capacitance means for setting a delay amount. A current source develops a bias current. A current switch is connected between the current source and the fast delay stage and the slow delay stage to switch the bias current between the fast delay stage and the slow delay stage. An output circuit is connected to the fast and slow delay stages for developing a differential output delayed relative to the differential input responsive to a ratio between fast delay stage current and slow delay stage current.

It is a feature of the invention that each of the differential amplifiers comprises an emitter coupled transistor pair with the differential input connected across bases of the transistors of the pair. The output circuit comprises a pair of load resistors connected between a voltage source and the collectors of the transistor pairs. The capacitance means comprises first and second capacitors connected oppositely between collectors of the slow delay stage transistor pair.

It is another feature of the invention that the output circuit comprises a pair of load resistors connected between a voltage source and the parallel connected fast delay stage and slow delay stage. The output circuit further comprises a cascode circuit connected between the slow delay stage and the load resistors to isolate capacitance of the slow delay stage from the fast delay stage. The cascode circuit may also be connected between the fast delay stage and the load resistors. The cascode circuit comprises cascode transistors.

It is a further feature of the invention that the output circuit comprises a buffer circuit including first and second emitter follower transistors.

It is yet another feature of the invention that the current switch comprises an emitter coupled transistor pair having the emitters connected to the current source, collectors connected to the respective fast and slow delay stages, and bases connected to a differential control input.

There is disclosed in accordance with another aspect of the invention a ring oscillator comprising a plurality of delay cells which control output amplitude. Each delay cell comprises a fast delay stage including a differential amplifier for connection to a differential input, and a slow delay stage including a differential amplifier connected in parallel with the fast delay stage differential amplifier and having capacitance means for setting a delay amount. A current source develops a bias current. A current switch is connected between the current source and the fast delay stage and the slow delay stage to switch the bias current between the fast delay stage and the slow delay stage, and an output circuit is connected to the fast and slow delay stages for developing a differential output delay relative to the differential input responsive to a ratio between fast delay stage current and slow delay stage current. Means are provided for connecting the plurality of delay cells to provide a ring, the connecting means connecting differential inputs of each delay cell to the differential output of another delay cell, wherein an odd number of said connections are inverted connections. Control means are connected to the current switch of each delay cell to control cell delay and thus oscillator frequency.

It is a feature of the invention that the oscillator generates quadrature outputs.

In accordance with the invention, the delay cell, when switched for fast operation, uses all of the bias current for the fast stage. Thus, the overall current consumption is lower for the same performance level as with prior delay cells. Also, the delay cell is limited to second-order effects of transistor device speed for higher average bias currents, and the speed of the slow stage can approach the speed of the fast stage.

Further features and advantages of the invention will be readily apparent from the specification and from the drawings.

DETAILED DESCRIPTION OF THE INVENTION

Figure 1:
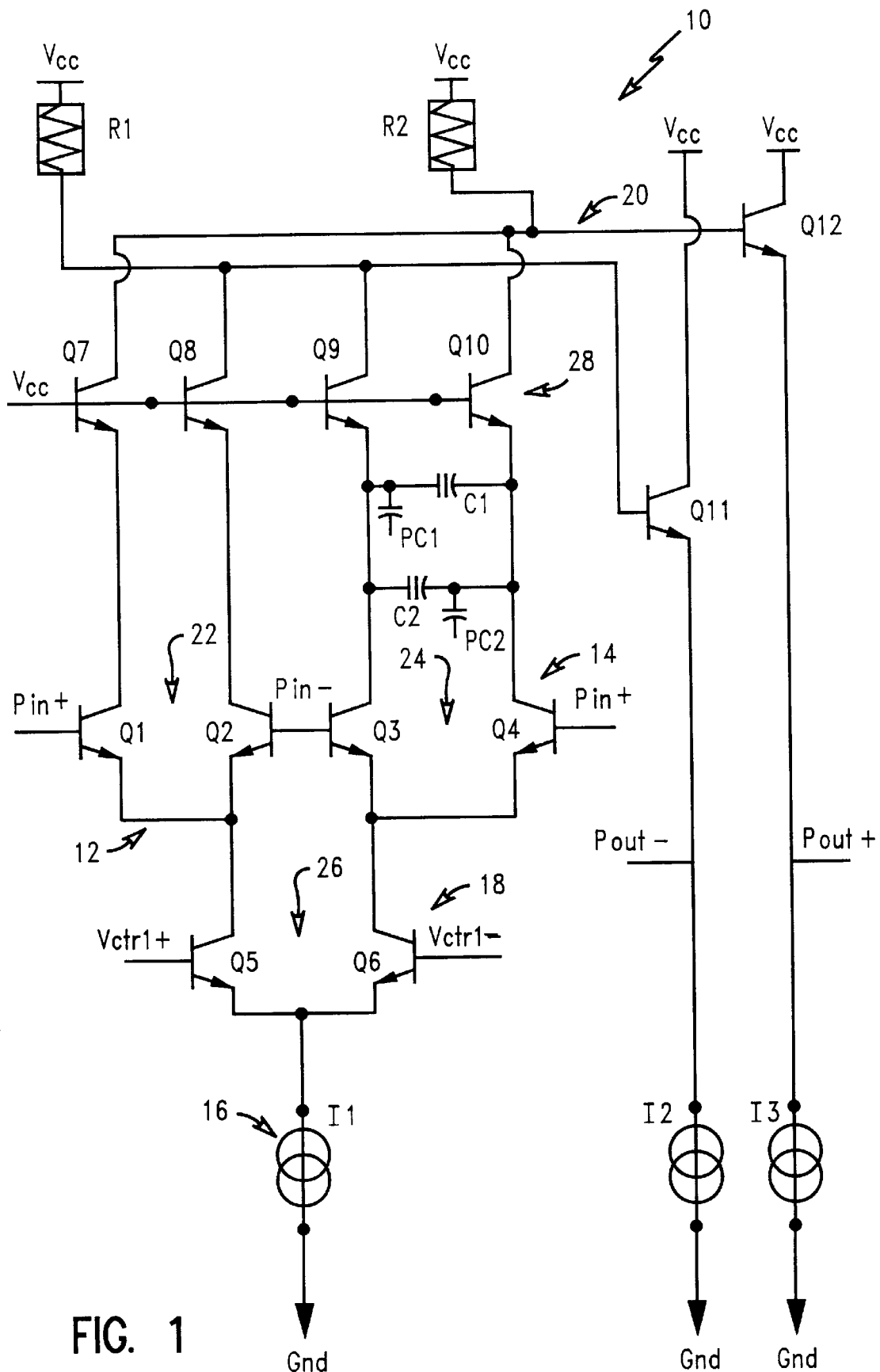
FIG. 1 is an electrical schematic of a circuit used in a delay cell according to the invention.

Referring to FIG. 1, an electrical schematic illustrates a circuit for a delay cell or delay element 10 in accordance with the invention. The delay cell 10 includes a fast delay stage 12 connected in parallel with a slow delay stage 14. A current source 16 develops a bias current. A current switch 18 is connected between the current source 16 and the fast delay stage 12 and slow delay stage 14 to switch the bias current between the fast delay stage 12 and the slow delay stage 14. An output circuit 20 is connected to the fast delay stage 12 and the slow delay stage 14.

The fast delay stage 12 comprises a differential amplifier 22 connected to a differential input labeled Pin+ and Pin-. The differential amplifier 22 comprises an emitter coupled transistor pair including transistors Q1 and Q2, with the differential input connected across the bases of the transistor pair. Particularly, the Pin+ input is connected to the base of the transistor Q1 and the Pin- input is connected to the base of the transistor Q2.

The slow delay stage 14 comprises a differential amplifier 24 connected to the differential inputs Pin+ and Pin-. The differential amplifier 24 comprises an emitter coupled transistor pair including transistors Q3 and Q4, with the differential input connected across the bases of the transistor pair. Particularly, the Pin+input is connected to the base of the transistor Q4 and the Pin- input is connected to the base of the transistor Q3.

The fast delay stage 12 is constructed as a simple differential amplifier. The slow delay stage 14 has capacitance to set the delay. Particularly, a pair of capacitors C1 and C2 are connected oppositely across the collectors of the differential pair transistors Q3 and Q4. The capacitors C1 and C2 create an RC delay in circuit operation. The circuit can also exhibit parasitic capacitance, represented by PC1 and PC2. By connecting the capacitors C1 and C2 in opposite directions, the parasitic capacitance is balanced. While the illustrated circuit uses a pair of capacitors, only a single capacitor is necessary.

The current switch 18 comprises an emitter coupled transistor pair including transistors Q5 and Q6. The collector of the transistor Q5 is connected to the emitters of the transistors Q1 and Q2. The collector of the transistor Q6 is connected to the emitters of the transistors Q3 and Q4. The transistor pair 26 is controlled by a differential control voltage applied to the bases of the transistors Q5 and Q6. Particularly, Vctrl+ is applied to the base of the transistor Q5 and Vctrl- is applied to the base of the transistor Q6.

The current source 16 is illustrated in the form of a bias current I1 connected between the emitter of the transistors Q5 and Q6 and ground. The current source 16 may utilize a current mirror responsive to a bias current input.

The output circuit 20 includes a cascode circuit 28. The cascode circuit 28 includes cascode transistors Q7, Q8, Q9 and Q10 having their emitters connected to the collectors of respective transistors Q1, Q2, Q3 and Q4. The bases of the cascode transistors Q7–Q10 are connected to a voltage source labeled VCC. As is apparent, the voltage source can be any suitable bias voltage, not necessarily VCC. The output circuit 20 also includes load resistors R1 and R2. The resistor R1 is connected between VCC and the collectors of the cascode transistors Q8 and Q9. The second load resistor R2 is connected between VCC and the collectors of cascode transistors Q7 and Q10.

The collectors of the transistors Q2 and Q3, via the respective cascode transistors Q8 and Q9, drive the base of an output buffer transistor Q11. Likewise, the collectors of the transistors Q1 and Q4, via the cascode transistors Q7 and Q10, drive the base of a second output buffer transistor Q12. The collectors of the transistors Q11 and Q12 are connected to VCC. The emitters of the buffer transistors Q11 and Q12 are connected to current sources 12 and 13. The current sources 12 and 13 may represent current mirror circuits that control a bias current input. A differential output is taken from the emitters of the transistors Q11 and Q12 and represented by Pout- and Pout+.

In operation, the delay cell 10 splits a constant bias current from the current source 16 through the fast delay stage 12 and the slow delay stage 14. As the ratio $I_{FAST}/I_{SLOW}$ increases, the delay cell speed increases. As discussed above, the delay is provided by the capacitors C1 and C2. The slow delay stage 14 is connected to the load resistors R1 and R2 via the cascode circuit 28. The cascode circuit 28 isolates the added capacitance in the slow delay stage 14 from the output of the fast delay stage 12, since the capacitance at the differential paired collectors, as well as the tail current, determines the speed. The cascode transistors Q7 and Q8 are optional between the fast delay stage 12 and the load resistors R1 and R2. The cascode devices Q7 and Q8 may be utilized to keep the circuit collector-emitter voltages of the speed determining differential pairs similar such that only additional capacitance, not Early voltage effects, determines the performance difference between the stages. Thus, all bias current is directed through the load, and the output level does not depend on delay. The differential output at the load resistors R1 and R2 may be buffered, as shown using the transistors Q11 and Q12, to maintain low minimum delay times.

The delay implemented by the delay cell 10 is controlled by the differential voltage Vctrl+ and Vctrl-, which controls the differential pair 26 to switch the bias current between the fast delay stage 12 and the slow delay stage 14.

The delay cell 10 in accordance with the invention, when switched for fast operation, uses all of the bias current for the fast delay stage 12. Thus, the overall current consumption is lower for the same performance level in the same technology as prior delay cell designs. Also, the difference between the fast and slow paths in the delay cell 10 is limited to second-order effects of transistor device speed for higher average bias current. Also, the speed of the slow delay stage 14 can approach the speed of the fast delay stage 12.

Figure 2:
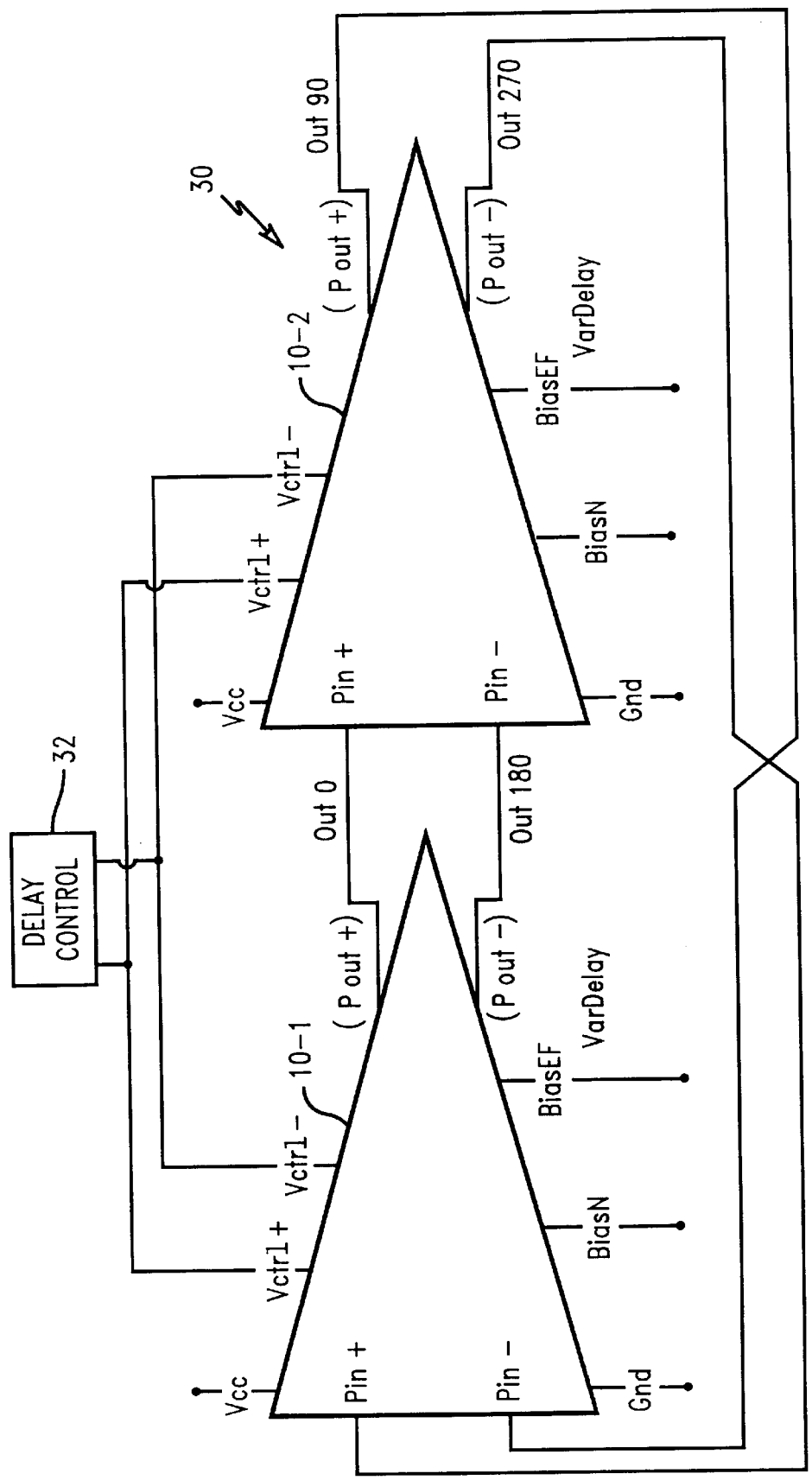
FIG. 2 is a block diagram illustrating a ring oscillator using the delay cell of FIG. 1.

Referring to FIG. 2, a block diagram illustrates a ring oscillator 30 using delay cells 10-1 and 10-2. Each of the delay cells 10-1 and 10-2 utilizes the circuit of the delay cell 10 of FIG. 1. Because of the differential nature, an odd number of inversions can be obtained using an even number of cells. Particularly, Pout+ and Pout− of the first delay cell 10-1 are connected to the respective Pin+ and Pin− of the second delay cell 10-2 to provide the inversion. Pout+ and Pout− of the second delay cell 10-2 are connected to Pin− and Pin+, respectively, of the first delay cell 10-1. As is apparent, any number of delay cells can be used, provided an odd number of inversions is utilized. The ring oscillator 30 of FIG. 2 satisfies feedback requirements for a ring oscillator, while allowing quadrature outputs to be generated as illustrated by various outputs labeled OUT 0, OUT 90, OUT 180 and OUT 270. Frequency of the ring oscillator 30 is controlled by a delay control circuit 32, which controls the differential voltage Vctrl+ and Vctrl− to each of the delay cells 10-1 and 10-2. The delay cells also illustrate inputs for VCC and ground, as well as biasN and biasEF. The biasN input is utilized for the current source 16. The biasEF input is used for the bias current for the emitter follower buffer transistors Q11 and Q12.

Figure 3:
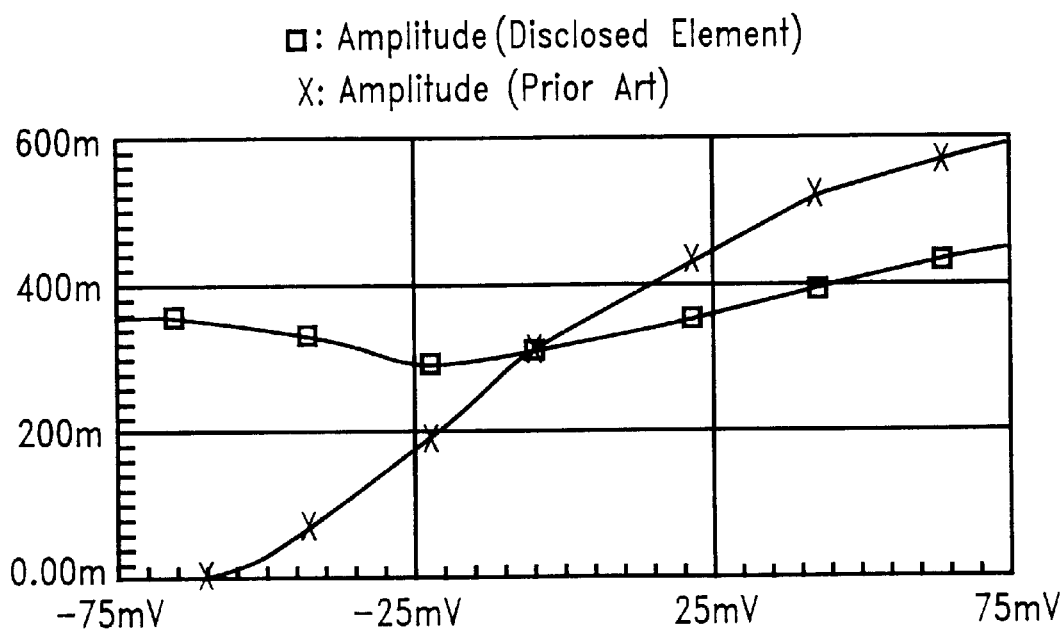
FIGS. 3 and 4 are curves illustrating operation of the delay cell of FIG. 1 compared to prior art delay cells.

FIG. 3 illustrates curves comparing output amplitude versus control voltage of a ring oscillator using the delay cell 10 of the present invention compared to the results obtained using a prior art delay element in the form of a differential amplifier with a varying bias current as the delay element. The curves show that the output voltage variation over 2.3 octaves for 400 microamp bias current and 150 millivolt control voltage swing changes by only a few dB. The prior delay cell obtains only 1.8 octaves tuning range with 25 dB output voltage variation over the range. Such variation would require additional automatic level control circuitry at added device counts and power consumption. Also, the variation leads to poor yield in noise performance at the low frequency end.

Figure 4:
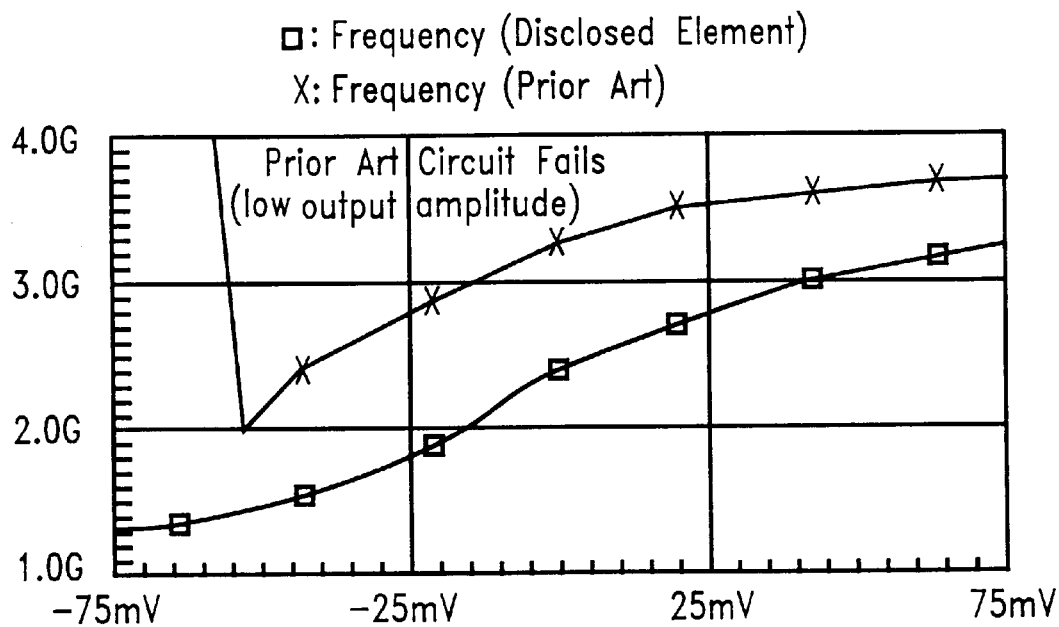

FIG. 4 illustrates comparison curves for frequency versus control voltage. Of note is that the shape of the frequency output versus control voltage exhibits an approximately linear region when using the disclosed delay element. The constant control voltage gain factor eases control voltage design.

In accordance with the invention, the output stage buffers can be any type of buffer, optimally providing a high impedance at the input and a low impedance at the output. They can be emitter followers, as shown, as well as source followers, using FETs instead of bipolar devices, or even operational amplifiers. Likewise, the NPN-based buffers could be replaced with PNP-based buffers with no theoretical loss of performance.

Moreover, the delay cell 10 is illustrated using an NPN configuration for the transistors. As is apparent to one skilled in the art, the delay cell circuit has an equivalent PNP configuration as well as both NMOS and PMOS configurations. With the PNP or PMOS configurations, a negative voltage supply is used, as is known.

Thus, in accordance with the invention there is illustrated a delay with controlled output amplitude using a single bias current for fast and slow delay stages.

I claim:

1. A delay circuit with controlled output amplitude comprising:

a fast delay stage comprising a differential amplifier for connection to a differential input;

a slow delay stage comprising a differential amplifier connected in parallel with the fast delay stage differential amplifier and having capacitance means for setting a delay amount;

a current source developing a bias current;

a current switch connected between the current source and the fast delay stage and the slow delay stage to switch the bias current between the fast delay stage and the slow delay stage; and an output circuit connected to the fast and slow delay stages for developing a differential output delayed relative to the differential input responsive to a ratio between fast delay stage current and slow delay stage current and including an isolation circuit for isolating the capacitance means from the fast delay stage.

2. The delay circuit of claim 1 wherein each of the differential amplifiers comprises an emitter coupled transistor pair with the differential input connected across bases of the transistor pair.

3. The delay circuit of claim 2 wherein the output circuit comprises a pair of load resistors connected between a voltage source and respective ones of the transistor pairs.

4. The delay circuit of claim 2 wherein the capacitance means comprises a capacitor connected between collectors of the slow delay stage transistor pair.

5. The delay circuit of claim 2 wherein the capacitance means comprises first and second capacitors connected oppositely between collectors of the slow delay stage transistor pair.

6. The delay circuit of claim 1 wherein the output circuit comprises a pair of load resistors connected between a voltage source and the parallel connected fast delay stage and slow delay stage.

7. The delay circuit of claim 1 wherein the isolation circuit comprises a cascode circuit connected between the slow delay stage and the load resistors to isolate capacitance of the slow delay stage from the fast delay stage.

8. The delay circuit of claim 1 wherein the isolation circuit comprises a cascode circuit connected between the slow delay stage and the fast delay stage and the load resistors to isolate capacitance of the slow delay stage from the fast delay stage.

9. The delay circuit of claim 7 wherein the cascode circuit comprises cascode transistors.

10. The delay circuit of claim 1 wherein the current switch comprises an emitter coupled transistor pair having the emitters connected to the current source, collectors connected to the respective fast and slow stages and bases connected to a differential control input.

11. The delay circuit of claim 1 wherein the output circuit comprise a buffer circuit.

12. The delay circuit of claim 11 wherein the buffer circuit comprises first and second emitter follower transistors.

13. A ring oscillator comprising:

a plurality of delay cells with controlled output amplitude each comprising a fast delay stage including a differential amplifier for connection to a differential input, a slow delay stage comprising a differential amplifier connected in parallel with the fast delay stage differential amplifier and having capacitance means for setting a delay amount, a current source developing a bias current, a current switch connected between the current source and the fast delay stage and the slow delay stage to switch the bias current between the fast delay stage and the slow delay stage, and an output circuit connected to the fast and slow delay stages for developing a differential output stage delayed relative to the differential input responsive to a ratio between fast delay stage current and slow delay stage current and including an isolation circuit for isolating the capacitance means from the fast delay stage;

means connecting the plurality of delay cells to provide a ring, the connecting means connecting the differential input of each delay cell to the differential output of another delay cell, wherein an odd number of said connections provide inversions; and control means connected to the current switch of each delay cell to control cell delay and thus oscillator frequency.

14. The ring oscillator of claim 13 wherein the oscillator generates quadrature outputs.

15. The ring oscillator of claim 13 wherein each of the differential amplifiers comprises an emitter coupled transistor pair with the differential input connected across bases of the transistor pair.

16. The ring oscillator of claim 15 wherein each output circuit comprises a pair of load resistors connected between a voltage source and respective ones of the transistor pairs.

17. The ring oscillator of claim 15 wherein each capacitance means comprises a capacitor connected between collectors of the slow delay stage transistor pair.

18. The ring oscillator of claim 15 wherein each capacitance means comprises first and second capacitors connected oppositely between collectors of the slow delay stage transistor pair.

19. The ring oscillator of claim 13 wherein each output circuit comprises a pair of load resistors connected between a voltage source and the parallel connected fast delay stage and slow delay stage.

20. The ring oscillator of claim 13 wherein each isolation circuit comprises a cascode circuit connected between the slow delay stage and the load resistors to isolate capacitance of the slow delay stage from the fast delay stage.

21. The ring oscillator of claim 13 wherein each isolation circuit comprises a cascode circuit connected between the slow delay stage and the fast delay stage and the load resistors to isolate capacitance of the slow delay stage from the fast delay stage.

22. The ring oscillator of claim 20 wherein each cascode circuit comprises cascode transistors.

23. The ring oscillator of claim 13 wherein each current switch comprises an emitter coupled transistor pair having the emitters connected to the current source, collectors connected to the respective fast and slow delay stages and bases connected to a differential control input.

24. The ring oscillator of claim 13 wherein each output circuit comprise a buffer circuit.

25. The ring oscillator of claim 24 wherein the buffer circuit comprises first and second emitter follower transistors.

26. A delay circuit with controlled output amplitude comprising:

a fast delay stage comprising a differential amplifier for connection to a differential input;

a slow delay stage comprising a differential amplifier connected in parallel with the fast delay stage differential amplifier having capacitance means for setting a delay amount;

a current source developing a bias current;

a current switch connected between the current source and the fast delay stage and the slow delay stage to switch the bias current from between the fast delay stage and the slow delay stage; and an output circuit connected to the fast and slow delay stages for developing a differential output delayed relative to the differential input responsive to a ratio between fast delay stage current and slow delay stage current, the output circuit comprising a pair of load resistors connected between a voltage source and the parallel connected fast delay stage and slow delay stage and a cascode circuit connected between the slow delay stage and the load resistors to isolate capacitance of the slow delay stage from the fast delay stage.

27. The delay circuit of claim 26 wherein the cascode circuit is connected between the slow delay stage and the fast delay stage and the load resistors to isolate capacitance of the slow delay stage from the fast delay stage.

28. The delay circuit of claim 26 wherein the cascode circuit comprises cascode transistors.

29. A ring oscillator comprising:

a plurality of delay cells with controlled output amplitude each comprising a fast delay stage including a differential amplifier for connecting to a differential input, a slow delay stage comprising a differential amplifier connected in parallel with the fast delay stage differential amplifier and having capacitance means for setting a delay amount, a current source developing a bias current, a current switch connected between the current source and the fast delay stage and the slow delay stage to switch the bias current between the fast delay stage and the slow delay stage, and an output circuit connected to the fast and slow delay stages for developing a differential output delayed relative to the differential input responsive to a ratio between fast delay stage current and slow delay stage current, the output circuit comprising a pair of load resistors connected between a voltage source and the parallel connected fast delay stage and slow delayed stage and a cascode circuit connected between the slow delay stage and the load resistors to isolate capacitance of the slow delay stage from the fast delay stage;

means connecting the plurality of delay cells to provide a ring, the connecting means connecting the differential input of each delay cell to the differential output of another delay cell, wherein an odd number of said connections provide inversions; and control means connected to the current switch of each delay cell to control cell delay and thus oscillator frequency.

30. The ring oscillator of claim 29 wherein the cascode circuit is connected between the slow delay stage and the fast delay stage and the load resistors to isolate capacitance of the slow delay stage from the fast delay stage.

31. The ring oscillator of claim 29 wherein each cascode circuit comprises cascode transistors.

* * * * *